(12) United States Patent
Zhang

(10) Patent No.: US 11,362,075 B2
(45) Date of Patent: Jun. 14, 2022

(54) MICRO LIGHT EMITTING DIODE DISPLAY SUBSTRATE, DEVICE AND FABRICATION METHOD THEREOF

(71) Applicant: BOE Technology Group Co., Ltd., Beijing (CN)

(72) Inventor: Lizhen Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/887,368

(22) Filed: May 29, 2020

(65) Prior Publication Data

US 2021/0098438 A1 Apr. 1, 2021

(30) Foreign Application Priority Data

Sep. 26, 2019 (CN) .......................... 201910917998.4

(51) Int. Cl.
*H01L 25/16* (2006.01)
*H01L 25/075* (2006.01)
*H01L 33/62* (2010.01)

(52) U.S. Cl.
CPC ........ *H01L 25/167* (2013.01); *H01L 25/0753* (2013.01); *H01L 25/162* (2013.01); *H01L 33/62* (2013.01); *H01L 2933/0066* (2013.01)

(58) Field of Classification Search
CPC . H01L 25/167; H01L 25/0753; H01L 25/162; H01L 33/62; H01L 2933/0066;
(Continued)

(56) References Cited

U.S. PATENT DOCUMENTS

2017/0179097 A1\* 6/2017 Zhang ................... H01L 27/124
2019/0229097 A1\* 7/2019 Takeya ................ H01L 21/6835
(Continued)

FOREIGN PATENT DOCUMENTS

| CN | 109791939 A | 5/2019 |
| CN | 109859647 A | 6/2019 |

(Continued)

OTHER PUBLICATIONS

Office Action dated Nov. 3, 2020 for application No. CN201910917998.4 with English translation attached.

*Primary Examiner* — Victor A Mandala
(74) *Attorney, Agent, or Firm* — Nath, Goldberg & Meyer; Joshua B. Goldberg

(57) ABSTRACT

Provided are micro light emitting diode display substrate, device and fabrication method thereof. The micro light emitting diode display substrate includes: a first base substrate; micro light emitting diodes on the first base substrate and including first and second electrodes; a common electrode layer on a side of a layer where the first and second electrodes are located away from the first base substrate, and electrically connected to the second electrodes of the micro light emitting diodes and spaced apart from the first electrodes; an interlayer insulating layer on a side of the common electrode layer away from the first base substrate and having via holes exposing the first electrodes of the micro light emitting diodes, respectively; first connection electrodes on a side of the interlayer insulating layer away from the first base substrate, and filling the via holes to be electrically connected to the first electrodes, respectively.

17 Claims, 4 Drawing Sheets

(58) Field of Classification Search
CPC .......... H01L 21/76895; H01L 23/5386; H01L 24/85; H01L 27/153; H01L 2224/85345
See application file for complete search history.

(56) References Cited

U.S. PATENT DOCUMENTS

| | | | |
|---|---|---|---|
| 2020/0118988 A1* | 4/2020 | Yueh | H01L 25/167 |
| 2020/0219820 A1* | 7/2020 | Chen | H01L 33/0093 |
| 2020/0381410 A1* | 12/2020 | Yueh | H01L 25/167 |
| 2021/0225823 A1* | 7/2021 | Liang | H01L 27/1262 |

FOREIGN PATENT DOCUMENTS

| | | |
|---|---|---|
| CN | 110224049 A | 9/2019 |
| CN | 110233200 A | 9/2019 |

* cited by examiner

MICRO LIGHT EMITTING DIODE DISPLAY SUBSTRATE, DEVICE AND FABRICATION METHOD THEREOF

CROSS REFERENCE TO RELATED APPLICATIONS

The present application claims priority to Chinese patent application No. 201910917998.4, filed on Sep. 26, 2019 to the National Intellectual Property Administration, PRC, the entire contents of which are incorporated herein by reference.

TECHNICAL FIELD

The application belongs to the field of display technology, and particularly relates to a micro light emitting diode display substrate, a micro light emitting diode display device and a fabrication method thereof.

BACKGROUND

The micro light emitting diode (micro LED) display technology is a technology that reduces the size of an existing LED to less than 100 micrometers (µm), and the size of the micro LED may be 1% of the size of the existing LED. The micro LEDs may be transferred and bonded to a driving substrate (for example, an array substrate) through a mass transfer technology, so as to form various micro LED display panels with different sizes.

SUMMARY

The present disclosure provides a micro light emitting diode display substrate, a micro light emitting diode display device and a fabrication method thereof.

In an aspect, the present disclosure provides a micro light emitting diode display substrate including: a first base substrate; a plurality of micro light emitting diodes on the first base substrate, the micro light emitting diodes including first electrodes and second electrodes; a common electrode layer on a side, away from the first base substrate, of a layer where the first electrodes and the second electrodes are located, the common electrode layer being electrically connected to the second electrodes of the micro light emitting diodes and spaced apart from the first electrodes of the micro light emitting diodes; an interlayer insulating layer on a side of the common electrode layer away from the first base substrate and having via holes for exposing the first electrodes of the micro light emitting diodes, respectively; and a plurality of first connection electrodes on a side of the interlayer insulating layer away from the first base substrate, and respectively filling the via holes to be electrically connected to the first electrodes, respectively.

In some embodiments, the display substrate further includes: an adhesion layer between the first base substrate and the micro light emitting diodes.

In some embodiments, the display substrate further includes: a conductive adhesive layer on a side of the first connection electrodes away from the first base substrate.

In some embodiments, orthographic projections of the first connection electrodes on the first base substrate cover orthographic projections of the first electrodes on the first base substrate and orthographic projections of the second electrodes on the first base substrate.

In some embodiments, the conductive adhesive layer includes anisotropic conductive adhesive.

In an aspect, the present disclosure provides a display device including the above display substrate.

In some embodiments, the display device further includes an array substrate arranged opposite to the display substrate. The array substrate includes a second base substrate, a plurality of driving devices on the second base substrate, and a plurality of second connection electrodes on a side of the driving devices away from the second base substrate and electrically connected to the driving devices, respectively. Each of the second connection electrodes is electrically connected to a corresponding one of the first connection electrodes.

In some embodiments, the display substrate further includes a conductive adhesive layer on a side of the first connection electrodes away from the first base substrate, the display substrate and the array substrate are adhered to each other by the conductive adhesive layer, and the second connection electrodes and the first connection electrodes are electrically connected by the conductive adhesive layer.

In some embodiments, the driving devices include driving transistors, and drain electrodes of the driving transistors are electrically connected to the second connection electrodes.

In an aspect, the present disclosure provides a method of fabricating a display substrate, including steps of: providing a plurality of micro light emitting diodes on a first base substrate, the micro light emitting diodes including first electrodes and second electrodes; forming a common electrode layer on a side, away from the first base substrate, of a layer where the first electrodes and the second electrodes of the micro light emitting diodes are located, the common electrode layer being electrically connected to the second electrodes of the micro light emitting diodes and spaced apart from the first electrodes of the micro light emitting diodes; forming an interlayer insulating layer on a side of the common electrode layer away from the first base substrate, the interlayer insulating layer being formed to have via holes respectively exposing the first electrodes of the micro light emitting diodes; and forming a plurality of first connection electrodes on a side of the interlayer insulating layer away from the first base substrate, the first connection electrodes being formed to respectively fill the via holes to be electrically connected to the first electrodes.

In some embodiments, the step of forming a common electrode layer includes: coating photoresist on the first electrodes of the micro light emitting diodes, the photoresist covering the first electrodes but not covering the second electrodes; forming, by deposition, a preliminary common electrode layer on a side, away from the first base substrate, of the layer where the first electrodes and the second electrodes of the micro light emitting diodes are located; removing a portion of the preliminary common electrode layer on the photoresist by performing photolithography on the preliminary common electrode layer to form the common electrode layer; and removing the photoresist.

In some embodiments, the step of forming an interlayer insulating layer includes: forming a preliminary interlayer insulating layer on a side of the common electrode layer away from the first base substrate by deposition, the preliminary interlayer insulating layer covering a lateral surface of the common electrode layer and a surface of the common electrode layer away from the first base substrate; and exposing the first electrodes of the micro light emitting diodes by etching the preliminary interlayer insulating layer to form the interlayer insulating layer.

In some embodiments, the step of forming a plurality of first connection electrodes includes: forming a first connection electrode layer electrically connected to the first electrodes on a side of the interlayer insulating layer away from the first base substrate by deposition; and removing a portion of the first connection electrode layer on a gap between any two adjacent micro light emitting diodes by etching the first connection electrode layer, to form the plurality of first connection electrodes.

In an aspect, the present disclosure provides a method of fabricating a display device, including steps of: preparing a first substrate according to the above method of fabricating the display substrate; providing a second substrate, the second substrate including a second base substrate, driving devices, and a plurality of second connection electrodes; and assembling the first substrate and the second substrate. The first and second substrates are assembled such that each of the second connection electrodes of the second substrate is electrically connected to a corresponding one of the first connection electrodes of the first substrate.

In some embodiments, the step of providing a second substrate includes: forming the driving devices on the second base substrate; and forming the plurality of second connection electrodes electrically connected to the driving devices on a layer where the driving devices are located.

DETAILED DESCRIPTION

To make those skilled in the art better understand the technical solutions of the present disclosure, the present disclosure will be further described in detail below in conjunction with the accompanying drawings and specific embodiments.

The inventor finds that at least the following problems exist in the prior art: generally in the prior art, micro LEDs are directly and massively transferred and bonded to an array substrate, and in this case, the micro LEDs need to be accurately positioned, two electrode rows of P electrode and N electrode of each micro LED are respectively aligned with and connected to two connection electrodes on the array substrate, and the number of the micro LEDs transferred at each time is large, and thus requirements for stability and accuracy of the mass transfer are high, thereby greatly increasing the difficulty of the mass transfer.

Figure 1:
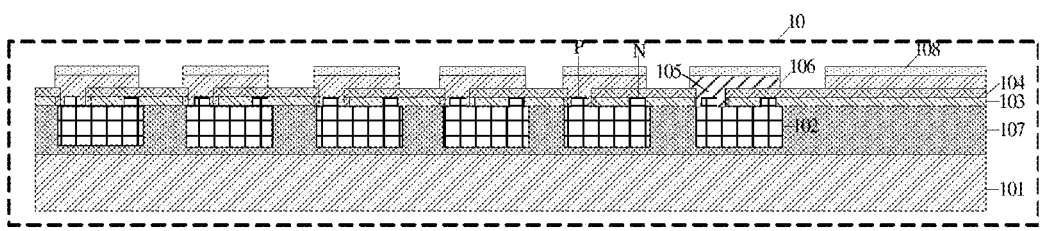
FIG. 1 is a cross-sectional view illustrating a structure of a micro light emitting diode display substrate according to an embodiment of the present disclosure.

FIG. 1 is a cross-sectional view illustrating a structure of a micro light emitting diode display substrate according to an embodiment of the present disclosure. As shown in FIG. 1, the micro LED display substrate 10 includes: a first base substrate 101, a plurality of micro LEDs 102 located on the first base substrate 101, the micro LEDs 102 including first electrodes P and second electrodes N; a common electrode layer 103 disposed on a side of the layer where the first electrode P and the second electrode N are located away from the first base substrate 101, the common electrode layer 103 being electrically connected to the second electrode N of each micro LED 102 and spaced apart from the first electrodes P; an interlayer insulating layer 104 disposed on a side of the common electrode layer 102 away from the first base substrate 101 and provided therein with via holes 105 respectively exposing the first electrodes P of the micro LEDs 102; and a plurality of first connection electrodes 106 disposed on a side of the interlayer insulating layer 104 away from the first base substrate 101 and respectively filling the via holes 105 to be electrically connected to the first electrodes P.

It should be noted that the first base substrate 101 may be a rigid substrate or a flexible substrate, and the first base substrate 101 may be made of a suitable material as needed. In some embodiments, the first base substrate 101 may be made of polyimide or glass. In the embodiment(s) of the present disclosure, a micro LED display substrate 10 according to an embodiment of the present disclosure will be described in detail by taking a rigid substrate as an example.

In the embodiment of the present disclosure, the first electrode P of each micro LED 102 may be connected to the first connection electrode 106 through a corresponding via hole 105, and the second electrodes N of the micro LEDs 102 may be commonly connected to the common electrode layer 103. The first connection electrode 106 may serve as an electrode for the alignment with a corresponding array substrate (not shown in the drawing). In the mass transfer process, the first electrode P of each micro LED 102 in the micro LED display substrate 10 may be aligned with and connected to a connector (not shown in the drawing) of the array substrate through the first connection electrode 106, and since the second electrodes N are connected to the common electrode layer 103 in advance, it is not necessary to align the second electrodes N with, and connect the second electrodes N to, the connectors (not shown in the drawing) of the array substrate. Therefore, the number of the micro LEDs' electrodes that are subjected to alignment and connection in the mass transfer process can decrease, thereby reducing the process difficulty, improving the stability and accuracy of the mass transfer, and thus improving the yield of the product.

In some embodiments, the plurality of micro LEDs 102 are of a same color, or at least some of the plurality of micro LEDs 102 are of different colors.

It should be noted that, in the embodiment of the present disclosure, the plurality of micro LEDs 102 may include micro LEDs of the same color, thereby realizing monochrome display. It is understood that the micro LEDs 102 may also include red micro LEDs, green micro LEDs and blue micro LEDs, thereby realizing full color display. It should be further noted that, due to the limitation of the fabrication process, micro LEDs 102 of only one color can be fabricated per process, and therefore, in the mass transfer process, the red micro LEDs, the green micro LEDs and the blue micro LEDs need to be transferred separately.

In some embodiments, as shown in FIG. 1, the micro LED display substrate 10 further include an adhesion layer 107 disposed between the first base substrate 101 and the micro LEDs 102.

It should be noted that the micro LEDs 102 may be fixed on the first base substrate 101 through the adhesion layer 107. In practice, the material of the adhesion layer can be selected as needed. In some embodiments, the adhesion layer 107 may be made of a material with a relatively large thickness, so that the micro LEDs sink into the adhesion layer 107, and only two electrodes of the micro LED may be exposed while ensuring good adhesion, thereby avoiding a process of filling a planarization layer between the micro LEDs 102, simplifying a fabrication process flow, and reducing fabrication process difficulty. It is understood that the adhesion layer 107 may also be a material with a small thickness to ensure that the micro LEDs 102 are fixed on the first base substrate 101. The specific materials of the adhesion layer 107 are not listed here.

In some embodiments, as shown in FIG. 1, the micro LED display substrate 10 further includes a conductive adhesive layer 108 on a side of the first connection electrodes 106 away from the first base substrate 101.

It should be noted that, the conductive adhesive layer 108 may be disposed on the first connection electrodes 106 in advance. Before the mass transfer, a protective film layer may be used to protect the conductive adhesive layer 108, so as to prevent foreign substance in the external environment from adhering to the conductive adhesive layer 108; and during the mass transfer, the protective film layer may be peeled off, and the first connection electrodes 106 are directly aligned with and connected to a corresponding array substrate (not shown in FIG. 1) through the conductive adhesive layer 108, so as to achieve the mass transfer of the micro LEDs 102.

In some embodiments, the conductive adhesive layer 108 includes anisotropic conductive adhesive.

It should be noted that the conductive adhesive layer 108 may be made of anisotropic conductive adhesive, which can avoid soldering for the alignment and connection between the first connection electrodes 106 and the array substrate (not shown in the drawing), thereby reducing the process difficulty and improving the mass transfer efficiency. It should be noted that the material of the conductive adhesive layer 108 can also be selected as needed, and is not listed here.

In some embodiments, as shown in FIG. 1, orthogonal projections of the first connection electrodes 106 on the first base substrate 101 cover orthogonal projections of the first electrodes P on the first base substrate 101 and orthogonal projections of the second electrodes N on the first base substrate 101.

In an aspect, the present disclosure provides a micro LED display device including the micro LED display substrate 10 according to the above embodiments.

Figure 2:
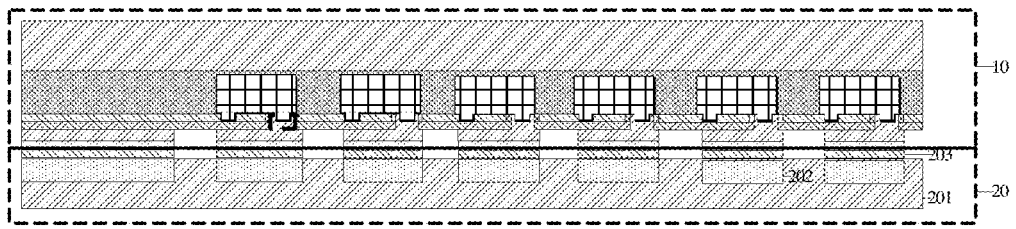
FIG. 2 is a cross-sectional view illustrating a structure of a micro light emitting diode display device according to an embodiment of the present disclosure.

FIG. 2 is a cross-sectional view illustrating a structure of a micro LED display device according to an embodiment of the present disclosure. As shown in FIG. 2, the micro LED display device further includes an array substrate 20 disposed correspondingly to the micro LED display substrate.

The array substrate 20 includes a second base substrate 201, a plurality of driving devices 202 on the second base substrate 201, and a plurality of second connection electrodes 203 on a layer where the driving devices 202 are located (i.e., on a side of the driving devices 202 away from the second base substrate 201) and electrically connected to the driving devices 202, respectively. Each of the second connection electrodes 203 is electrically connected to a corresponding one of the first connection electrodes 106.

It should be noted that the first connection electrodes 106 of the micro LED display substrate 10 including the plurality of micro LEDs 102 may be aligned with and connected to the second connection electrodes 203 of the array substrate 20 in one-to-one correspondence by a mass transfer process, and the driving devices 202 in the array substrate 20 may output control current to the first electrodes P of the micro LEDs 102 to drive the micro LEDs 102 to emit light, so that the display brightness of each micro LED 102 can be adjusted by adjusting the current value of the control current, and thus the display of the whole display screen can be realized.

In some embodiments, the driving device 202 may include a driving transistor, and a drain electrode of the drive transistor is connected to the second connection electrode 203.

It should be noted that the driving transistor may be a bottom gate type transistor. When an operation-level voltage is input to a gate electrode of the driving transistor and the source electrode and the drain electrode are electrically connected to each other, the control current may be transmitted to the second connection electrode 203 through the drain electrode of the driving transistor, so as to drive each micro LED 102 in the micro LED display substrate 10 to emit light, thereby realizing display of a monochrome or multi-color image. It is to be understood that the driving transistor in the embodiment of the present disclosure may also be a top gate type transistor or another type of transistor, and in practice, the type of the driving transistor may be selected as needed, which is not limited herein.

In some embodiments, the display substrate 10 and the array substrate 20 are adhered to each other through the conductive adhesive layer 108 of the display substrate 10, and the second connection electrodes 203 and the first connection electrodes 106 are electrically connected by the conductive adhesive layer 108.

Figure 3:
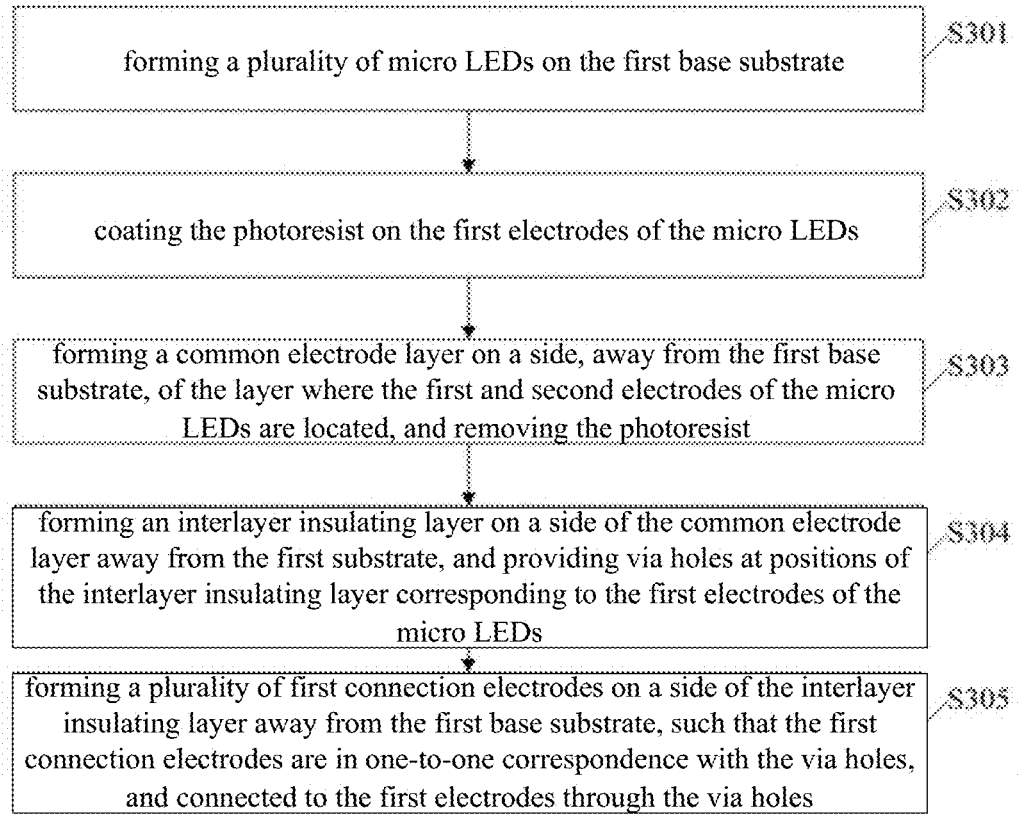
FIG. 3 is a flowchart of a method of fabricating a micro light emitting diode display substrate according to an embodiment of the present disclosure.

FIG. 3 is a flowchart of a method of fabricating a micro LED display substrate according to an embodiment of the present disclosure. As shown in FIG. 3, the method of fabricating a micro LED display substrate includes steps S301 to S305.

At step S301, a plurality of micro LEDs are provided on a first base substrate.

Figure 4A:
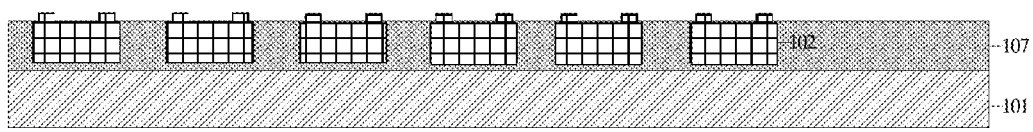
FIGS. 4a to 4g are cross-sectional views illustrating intermediate structures of steps in a method of fabricating a micro light emitting diode display substrate according to an embodiment of the present disclosure.

In the above step S301, as shown in FIG. 4a, an adhesion layer 107 may be coated on the first base substrate 101 in advance, and the plurality of micro LEDs 102 are distributed and fixed on the first base substrate 101 in an array through the adhesion layer 107. The first electrodes P and the second electrodes N of the micro LEDs 102 are on a side of the micro LEDs away from the first base substrate 101.

At step S302, photoresist is coated on the first electrode of each micro LED, the photoresist covering the first electrodes but not covering the second electrodes.

Figure 4B:
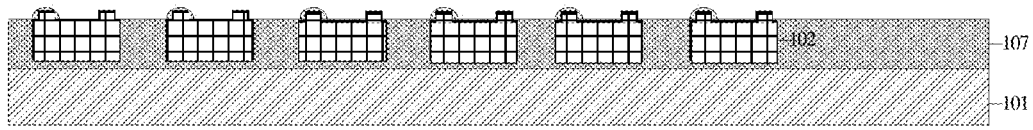

In the above step S302, as shown in FIG. 4b, a layer of photoresist is coated on the layer where the first electrodes P and the second electrodes N of the micro LEDs 102 are located, and is subjected to etching such that only a portion of the photoresist covering the first electrodes P is remained, thereby achieving protection of the first electrodes P.

At step S303, a common electrode layer is formed on a side, away from the first base substrate, of the layer where the first electrodes and the second electrodes of the micro LEDs are located, and the photoresist is removed.

Figure 4C:
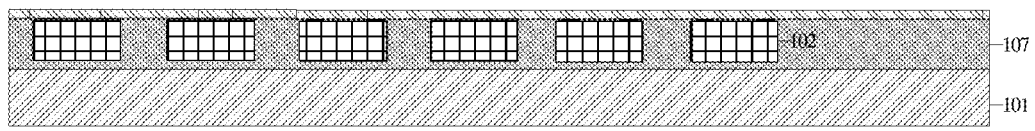
Figure 4D:
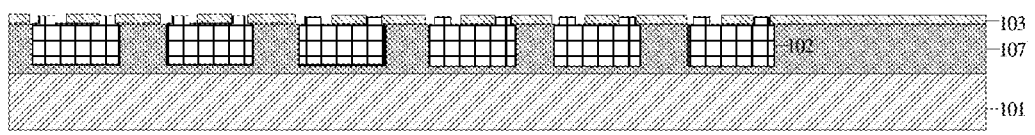

In the above step S303, as shown in FIG. 4c, a preliminary common electrode layer is formed on the first electrodes P and the second electrodes N by deposition. Thereafter, as shown in FIG. 4d, the preliminary common electrode layer is subjected to photolithography to remove a portion of the preliminary common electrode layer on the photoresist to form the common electrode layer 103, and the photoresist covering the first electrodes P is removed to expose the first electrodes P. To this end, the common electrode layer 103 is electrically connected to the second electrode N of each micro LED 102 and spaced apart from the first electrodes P. In the embodiment of the present disclosure, the common electrode layer 103 is formed by using a photolithography process, which has lower difficulty than a conventional soldering process, thereby improving the fabrication efficiency.

At step S304, an interlayer insulating layer is formed on a side of the common electrode layer away from the first base substrate, the interlayer insulating layer being formed to have via holes exposing the first electrodes of the micro LEDs, respectively.

Figure 4E:
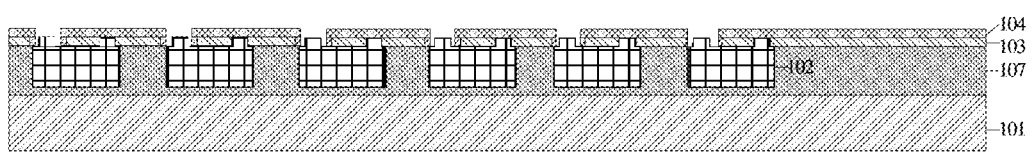

In the above step S304, as shown in FIG. 4e, a preliminary interlayer insulating layer 104 is formed on the common electrode layer 103 by deposition, and configured to electrically insulate the common electrode layer 103 from the first connection electrodes 106 to be formed thereon, so as to prevent short circuit between the common electrode layer 103 and the first connection electrodes 106, which may cause damage to the micro LEDs 102. Since the common electrode layer 103 is spaced apart from the first electrodes P, when the interlayer insulating layer 104 is formed as shown in FIG. 4e, the interlayer insulating layer 104 may be recessed at positions corresponding to the first electrodes P. The preliminary interlayer insulating layer 104 is etched at the positions thereof corresponding to the first electrodes P, which not only ensures the exposure of the first electrodes P, but also realizes that the interlayer insulating layer 104 covers an edge of the common electrode layer 103 (for example, covers a lateral surface of the common electrode layer 103), thereby avoiding a short circuit between the common electrode layer 103 and the first electrodes P, and preventing the micro LEDs 102 from being damaged.

At step S305, a plurality of first connection electrodes are formed on a side of the interlayer insulating layer away from the first base substrate, the first connection electrodes being formed to respectively fill the via holes to be electrically connected to the first electrodes.

Figure 4F:
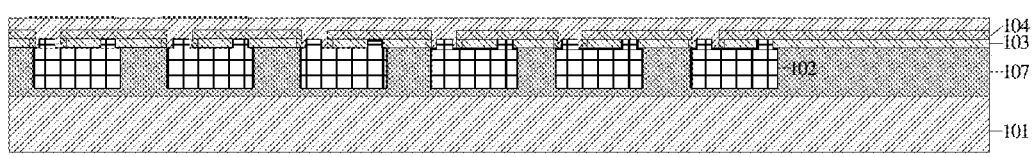
Figure 4G:
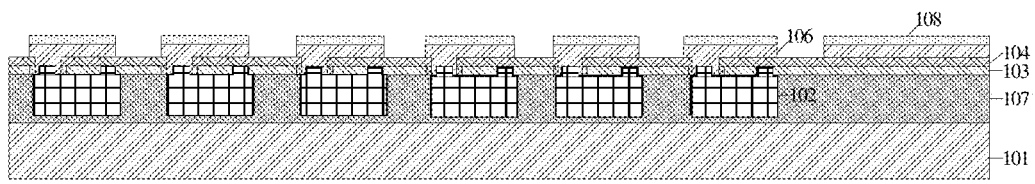

In the above step S305, as shown in FIG. 4f, a first connection electrode layer is formed on the interlayer insulating layer 104 by deposition. As shown in FIG. 4g, a plurality of first connection electrodes 106 that are spaced apart may be formed by performing photolithography on the first connection electrode layer to remove a portion of the first connection electrode layer positioned on a gap of any two adjacent micro LEDs 102. Next, a conductive adhesive layer 108 is coated on each of the first connection electrodes 106. In the embodiment of the present disclosure, the connection electrodes 106 with a larger area can be formed by using a photolithography process, which can reduce the alignment and bonding difficulty of the micro LEDs in mass transfer process, thereby improving the mass transfer efficiency.

In an aspect, embodiments of the present disclosure provide a method of fabricating a micro LED display device, which includes the method of fabricating the micro LED display substrate according to the above embodiments.

Figure 5:
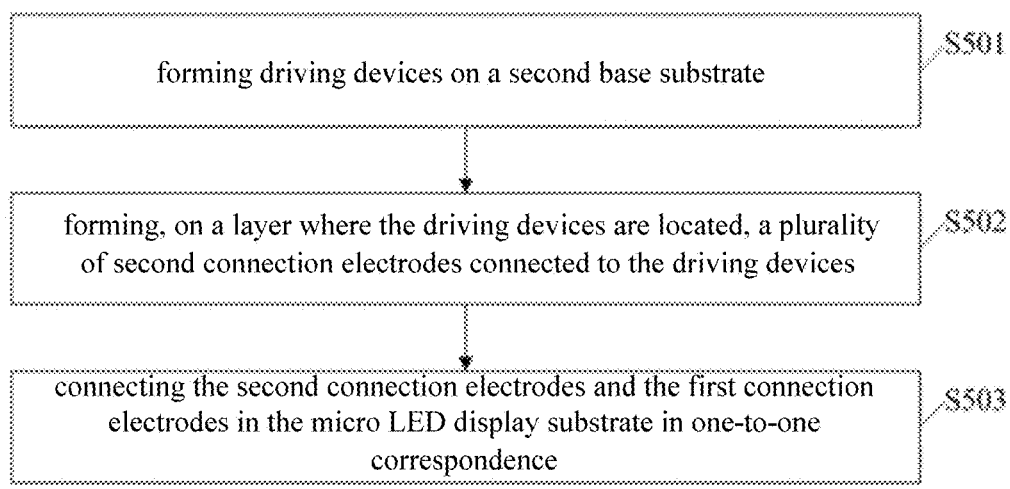
FIG. 5 is a flowchart of a method of fabricating a micro light emitting diode display device according to an embodiment of the present disclosure.

FIG. 5 is a flowchart of a method of fabricating a micro LED display device according to an embodiment of the present disclosure. As shown in FIG. 5, the method of fabricating a micro LED display device further includes steps S501 to S503.

At step S501, driving devices are formed on a second base substrate.

Figure 6A:
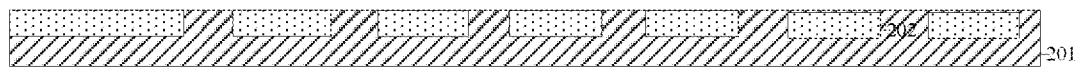
FIGS. 6a to 6c are cross-sectional views illustrating intermediate structures of steps in a method of fabricating a micro light emitting diode display device according to an embodiment of the present disclosure.

In the above step S501, as shown in FIG. 6a, driving devices 202 may be formed on the second base substrate 201, and when the driving device 202 is a driving transistor, an active layer, a gate insulating layer, an interlayer dielectric layer, a source electrode and a drain electrode of the driving transistor may be sequentially formed on the second base substrate 201.

At step S502, a plurality of second connection electrodes electrically connected to the driving devices are formed on the layer where the driving devices are located.

Figure 6B:
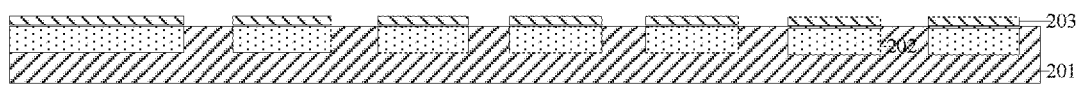

In the above step S502, as shown in FIG. 6b, a plurality of second connection electrodes 203 are formed by deposition and photolithography on the layer on which the driving transistors 202 are located. The plurality of second connection electrodes 203 may be electrically connected to the drain electrodes of the driving transistors, respectively.

At step S503, each of the second connection electrodes is electrically connected to a corresponding one of the first connection electrodes in the micro LED display substrate.

Figure 6C:
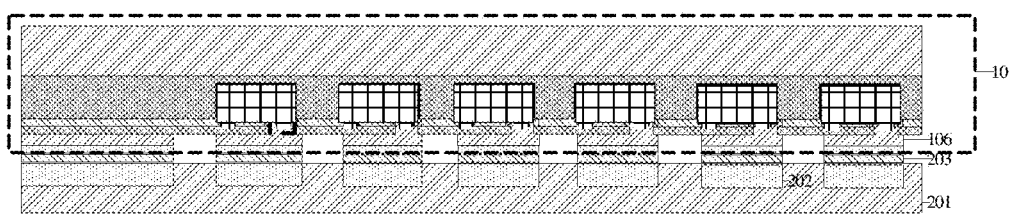

In the above step S503, as shown in FIG. 6c, the formed second connection electrodes 203 of the array substrate are electrically connected to the first connection electrodes 106 of the micro LED display substrate 10 in one-to-one correspondence, so as to form the micro LED display device. The driving devices 202 in the array substrate 20 may output control current to the first electrodes P of the micro LEDs 102 to drive each micro LED 102 to emit light, so that the display brightness of each micro LED 102 can be adjusted by adjusting the current value of the control current, thereby realizing the display of the whole display screen.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A micro light emitting diode display substrate, comprising:
   a first base substrate;
   a plurality of micro light emitting diodes on the first base substrate, the micro light emitting diodes comprising first electrodes and second electrodes;
   a common electrode layer on a side, away from the first base substrate, of a layer where the first electrodes and the second electrodes are located, the common electrode layer being electrically connected to the second electrodes of the micro light emitting diodes and spaced apart from the first electrodes of the micro light emitting diodes;
   an interlayer insulating layer on a side of the common electrode layer away from the first base substrate and having via holes for exposing the first electrodes of the micro light emitting diodes, respectively; and
   a plurality of first connection electrodes on a side of the interlayer insulating layer away from the first base substrate, and respectively filling the via holes to be electrically connected to the first electrodes, respectively,
   wherein the interlayer insulating layer is interposed between the first connection electrodes and the common electrode layer in a thickness direction of the first base substrate, and a surface of the common electrode layer away from the first base substrate and a surface of the first connection electrodes away from the first base substrate are spaced apart in the thickness direction of the first base substrate.

2. The micro light emitting diode display substrate of claim 1, further comprising:
an adhesion layer between the first base substrate and the micro light emitting diodes.

3. The micro light emitting diode display substrate of claim 1, further comprising:
a conductive adhesive layer on a side of the first connection electrodes away from the first base substrate.

4. The micro light emitting diode display substrate of claim 1, wherein orthographic projections of the first connection electrodes on the first base substrate cover orthographic projections of the first electrodes on the first base substrate and orthographic projections of the second electrodes on the first base substrate.

5. The micro light emitting diode display substrate of claim 3, wherein the conductive adhesive layer comprises anisotropic conductive adhesive.

6. A display device, comprising the micro light emitting diode display substrate of claim 1.

7. The display device of claim 6, further comprising: an array substrate arranged opposite to the micro light emitting diode display substrate,
wherein the array substrate comprises a second base substrate, a plurality of driving devices on the second base substrate, and a plurality of second connection electrodes on a side of the driving devices away from the second base substrate and electrically connected to the driving devices, respectively, and
each of the second connection electrodes is electrically connected to a corresponding one of the first connection electrodes.

8. The display device of claim 7, wherein the micro light emitting diode display substrate further comprises a conductive adhesive layer on a side of the first connection electrodes away from the first base substrate,
the micro light emitting diode display substrate and the array substrate are adhered to each other by the conductive adhesive layer, and
the second connection electrodes and the first connection electrodes are electrically connected by the conductive adhesive layer.

9. The display device of claim 7, wherein the driving devices comprise driving transistors, and
drain electrodes of the driving transistors are electrically connected to the second connection electrodes.

10. The display substrate of claim 1, wherein an orthographic projection of the first connection electrodes on the first substrate partially overlaps with an orthographic projection of the common electrode layer on the first substrate.

11. A method of fabricating a display substrate, comprising steps of:
providing a plurality of micro light emitting diodes on a first base substrate, the micro light emitting diodes comprising first electrodes and second electrodes;
forming a common electrode layer on a side, away from the first base substrate, of a layer where the first electrodes and the second electrodes of the micro light emitting diodes are located, the common electrode layer being electrically connected to the second electrodes of the micro light emitting diodes and spaced apart from the first electrodes of the micro light emitting diodes;
forming an interlayer insulating layer on a side of the common electrode layer away from the first base substrate, the interlayer insulating layer being formed to have via holes respectively exposing the first electrodes of the micro light emitting diodes; and
forming a plurality of first connection electrodes on a side of the interlayer insulating layer away from the first base substrate, the first connection electrodes being formed to respectively fill the via holes to be electrically connected to the first electrodes,
wherein the interlayer insulating layer is interposed between the first connection electrodes and the common electrode layer in a thickness direction of the first base substrate, and a surface of the common electrode layer away from the first base substrate and a surface of the first connection electrodes away from the first base substrate are spaced apart in the thickness direction of the first base substrate.

12. The method of claim 11, wherein the step of forming a common electrode layer comprises:
coating photoresist on the first electrodes of the micro light emitting diodes, the photoresist covering the first electrodes but not covering the second electrodes;
forming, by deposition, a preliminary common electrode layer on a side, away from the first base substrate, of the layer where the first electrodes and the second electrodes of the micro light emitting diodes are located;
removing a portion of the preliminary common electrode layer on the photoresist by performing photolithography on the preliminary common electrode layer, to form the common electrode layer; and
removing the photoresist.

13. The method of claim 11, wherein the step of forming an interlayer insulating layer comprises:
forming a preliminary interlayer insulating layer on a side of the common electrode layer away from the first base substrate by deposition, the preliminary interlayer insulating layer covering a lateral surface of the common electrode layer and a surface of the common electrode layer away from the first base substrate; and
exposing the first electrodes of the micro light emitting diodes by etching the preliminary interlayer insulating layer, to form the interlayer insulating layer.

14. The method of claim 11, wherein the step of forming a plurality of first connection electrodes comprises:
forming a first connection electrode layer electrically connected to the first electrodes on a side of the interlayer insulating layer away from the first base substrate by deposition; and
removing a portion of the first connection electrode layer on a gap between any two adjacent micro light emitting diodes by etching the first connection electrode layer, to form the plurality of first connection electrodes.

15. A method of fabricating a display device, comprising steps of:
preparing a first substrate according to the method of claim 11;
providing a second substrate, the second substrate comprising a second base substrate, driving devices, and a plurality of second connection electrodes; and
assembling the first substrate and the second substrate,
wherein the first substrate and the second substrate are assembled such that each of the second connection electrodes of the second substrate is electrically connected to a corresponding one of the first connection electrodes of the first substrate.

16. The method of claim 15, wherein the step of providing a second substrate comprises:

forming the driving devices on the second base substrate; and forming the plurality of second connection electrodes electrically connected to the driving devices on a layer where the driving devices are located.

17. The method of claim 11, wherein an orthographic projection of the first connection electrodes on the first substrate partially overlaps with an orthographic projection of the common electrode layer on the first substrate.

* * * * *